United States Patent [19]
Khoury et al.

[11] Patent Number: 6,121,910
[45] Date of Patent: Sep. 19, 2000

[54] FREQUENCY TRANSLATING SIGMA-DELTA MODULATOR

[75] Inventors: John Khoury, New Providence; Hai Tao, Elmwood Park, both of N.J.

[73] Assignee: The Trustees of Columbia University in the City of New York, New York, N.Y.

[21] Appl. No.: 09/118,417

[22] Filed: Jul. 17, 1998

[51] Int. Cl.[7] .................................................. H03M 3/00
[52] U.S. Cl. ............................................................ 341/143
[58] Field of Search ............................................. 341/143

[56] References Cited

U.S. PATENT DOCUMENTS

| | | | |
|---|---|---|---|
| 5,113,189 | 5/1992 | Messer et al. | 341/143 |
| 5,157,343 | 10/1992 | Voorman | 329/319 |
| 5,557,642 | 9/1996 | Williams | 375/316 |
| 5,565,868 | 10/1996 | Azrouf et al. | 341/155 |
| 5,619,536 | 4/1997 | Gourgue | 375/316 |
| 5,764,171 | 6/1998 | Stikvoort | 341/143 |
| 5,952,947 | 9/1999 | Nussbaum et al. | 341/143 |
| 5,959,562 | 9/1999 | Wiesbauer | 341/143 |
| 5,963,160 | 10/1999 | Wilson et al. | 341/143 |

OTHER PUBLICATIONS

S. Jantzi, R. Schreier and M. Snelgrove, Chapter 9, "The Design of Bandpass Delta–Sigma ADCs", Delta–Sigma Data Converters: Theory, Design, and Simulation, edited by S. Norsworth, R. Schreier and G.C. Temes, IEEE Press 1997.

R. Schreier and G.C. Temes et al., "Multibit Bandpass Delta–Sigma Modulators Using N–Path Structures", IEEE International Symposium on Circuits and Systems, pp. 593–596, 1992.

S. Jantzi and K. Martin et al., "A Complex Bandpass Sigma–Delta Converter for Digital Radio", IEEE International Symposium on Circuits and Systems, pp. 453–456, 1994.

*Primary Examiner*—Brian Young
*Assistant Examiner*—Jason L. W. Kost
*Attorney, Agent, or Firm*—Baker Botts LLP

[57] ABSTRACT

An electronic device for converting an analog input signal into a digital output signal includes: a summing device for adding the analog input signal with a feedback analog signal and for generating a summer output signal representative of the sum of the analog input signal and the feedback analog signal; an analog filter coupled to the summing device for filtering undesired signal components from the summer output signal; an analog mixer receiving a signal having a first mixer frequency and coupled to receive the output of the analog filter for frequency translating the filtered summer output signal to a frequency translated summer output signal having one or more frequency components different than the input frequency; a quantizer coupled to the analog mixer for sampling the frequency translated summer output signal at a sampling frequency and for generating the digital output signal; and a feedback branch coupled between the quantizer and summing device for providing the feedback analog signal to the summing device. The feedback branch includes a digital mixer coupled to the quantizer, the digital mixer having a second mixer frequency for frequency translating the digital output signal to a frequency translated digital output signal; and a digital-to-analog converter for converting the frequency translated digital output signal to the feedback analog signal having a frequency equal to the input frequency. The device utilizes frequency translation inside the feedback loop to perform direct conversion of the analog signal to baseband.

20 Claims, 9 Drawing Sheets

FREQUENCY TRANSLATING SIGMA-DELTA MODULATOR

BACKGROUND OF THE INVENTION

Optimal performance of digital radio receivers is achieved when the analog-to-digital (A/D) conversion of received analog signals is performed as close as possible to the receive antenna. While A/D conversion at the antenna is not commercially viable due to large bandwidth and high dynamic range requirements, conversion at the intermediate frequency (IF) of a superheterodyne receiver is possible. Conventional narrowband AID conversion techniques centered at 10.7 MHZ are known using complementary metal-oxide semiconductor (CMOS) and/or CMOS having on chip bipolar transistor (BiCMOS) technologies, however conventional signal conversion at much higher frequencies remain inadequate and at the very least require enhancement of existing CMOS-based A/D converter architectures.

IF frequencies for most wireless receivers typically range from 70 MHZ to 400 MHZ. If the received radio signal is converted to digital form early in the reception process, several benefits result. First, digital processing at an earlier stage permits a high degree of programmability in the filtering and demodulation process, thus easing compatibility with various wireless standards. Second, for in-phase/quadrature (I/Q) receivers, demodulation when performed digitally does not suffer degradation due to mismatches in the in-phase and quadrature channels as presently occurs with conventional analog I/Q demodulation techniques. Third, high frequency A/D conversion allows for improved manufacturability of a chip having both analog and digital circuitry because the system solution will have a higher percentage of digital circuitry. And finally, once the received signal is converted to a digital signal, logic circuits processing the data can operate at relatively low voltages to save power without suffering a loss in dynamic range as would be the case with conventional analog circuits.

Various digital receiver architectures have been devised of which a few are briefly described herein. A first conventional homodyne receiver translates the incoming radio frequency (RF) signal to baseband after limited filtering and amplification at RF. Channel selection and signal amplification are performed at baseband prior to the A/D conversion, and in-phase and quadrature paths are required to separate the image frequencies. A digital signal processor (DSP) is then required for signal demodulation, symbol timing recovery and maximum likelihood detection to yield the transmitted digital data. Four basic problems exist with this architecture: (1) mismatches between the analog I/Q paths limit image frequency separation, (2) the frequency of the local oscillator is identical to the desired input frequency and can inadvertently couple to the antenna and radiate thus causing interference, (3) large DC offset in the signal path can be generated thus reducing the available dynamic range of the receiver, and (4) the high dynamic range required of the baseband filters is extremely difficult to achieve with integrated circuit active filters.

To avoid these problems, the most common approach is to use a superheterodyne receiver. Instead of frequency translating the received analog signal to baseband after RF amplification, as with conventional homodyne receivers, a first local oscillator translates the spectrum to an IF frequency for purposes of channel selection and amplification. I/Q branches are then used in the demodulation process. Although performance is better as compared with homodyne receivers, I/Q mismatches in the analog signal path remain problematical. The difficulty with conventional superheterodyne receivers is obtaining an adequately high-quality factor (Q) bandpass filter and amplifier at IF frequencies. Such a high-Q, high dynamic range bandpass filter cannot presently be implemented with analog active filters in very large scale integration (VLSI) circuits, but is readily available using off-chip with surface acoustic wave filters.

Other conventional designs for performing A/D conversion at the IF frequency have shown to alleviate many of the aforementioned problems. For example, in a variation of the conventional superheterodyne receiver, mixers and I/Q paths are implemented digitally to eliminate frequency "leakage." Channel selection filters are also implemented as digital lowpass filters after A/D conversion of the received signal. Other designs further include an analog bandpass filter at IF frequencies to attenuate large out-of-band signals to limit the dynamic range requirements of the A/D converter. The bandpass filter serves the additional function of anti-aliasing the bandpass A/D converter, and as such the resulting lower filter Q eases the filter's frequency accuracy and noise requirements.

Conventional discrete-time bandpass sigma-delta ($\Sigma$-$\Delta$) modulators, for example, have been used for digitizing narrowband input signals centered at one fourth the sampling frequency, $f_s/4$, of the A/D converter. See S. Jantzi, R. Schreier and M. Snelgrove, "The Design of Bandpass Delta-Sigma ADCs," Delta-Sigma Data Converters: Theory, Design, and Simulation, edited by S. Norsworthy, R. Schreier and G. C. Temes (IEEE Press 1997). Accordingly, analog filters resonating at $f_s/4$ are used to suppress the quantization error in the desired frequency band. This however poses two primary problems that limit the resolution of discrete-time bandpass sigma-delta modulators when the desired center frequencies are in the order of 10's of MHZ's.

A first problem is due to resonant frequency errors caused by capacitor mismatches in switched-capacitor implementations of conventional discrete-time bandpass $\Sigma$-$\Delta$ modulators. These mismatches cause significant quantization noise to appear in the signal band, and as such degrade the performance of the $\Sigma$-$\Delta$ modulator. N-Path filtering techniques have been shown to eliminate resonant frequency errors in switched capacitor and other sampled data implementations. See R. Schreier and G. C. Temes, "Multibit Bandpass Delta-Sigma Modulators Using N-Path Structures," IEEE International Symposium on Circuits and Systems, pp. 593–596 (1992). However, resonant frequency errors remain problematical for continuous-time resonators. Integrated active continuous resonators would require sophisticated self-tuning of the resonant frequency.

Second, in sampled-data resonators, the front-end circuitry must sample and hold the input waveform to an accuracy exceeding the A/D requirements. For example, converting narrowband signals centered at 70 MHZ with the passband of the A/D converter centered at $f_s/4$ having an accuracy of 12 bits would require the sample-and-hold (S/H) circuitry to sample at 280 MHZ with an accuracy exceeding 12 bits, e.g., 13 bits. These are extremely difficult requirements for any conventional integrated circuit technology, especially CMOS.

Although conventional continuous-time bandpass $\Sigma$-$\Delta$ converters can operate at very high sample rates without the front-end S/H circuitry, accurately controlling the center frequency and Q of conventional continuous-time bandpass $\Sigma$-$\Delta$ converters can be very difficult. These converters require high-Q resonators in order to obtain adequate quantization error rejection and avoidance of dead zones.

Also, in continuous time Σ-Δ modulators, the shape of the digital-to-analog pulse feedback to the input of the converter can limit resolution if excessive sampling jitter or high frequency noise is present. As such, careful control of the feedback signal characteristics is required to control the modulator's stability and dynamic range.

Therefore, it is a principle object of the present invention to provide a Σ-Δ modulator having minimal increase of passband quantization noise due to resonant center frequency errors.

It is another object of the present invention to provide a Σ-Δ modulator having a continuous-time resonator with moderate Q and center frequency accuracy requirements.

It is yet another object of the present invention to provide a Σ-Δ modulator for the direct conversion of radio or intermediate frequencies to baseband or other low or intermediate frequencies for use in wireless communication systems and other digital receiver systems.

Further objects, features and advantages of the invention will become apparent from the following detailed description taken in conjunction with the accompanying figures showing illustrative embodiments of the invention.

SUMMARY OF THE INVENTION

The aforedescribed limitations and inadequacies of conventional analog-to-digital converters are substantially overcome by the present invention, which in a preferred embodiment includes: a summing device for adding an analog input signal having an input frequency with a feedback analog signal having the same frequency, and for generating a summer output signal representative of the sum of the analog input signal and the feedback analog signal; an analog filter coupled to the summing device for filtering undesired signal components from the summer output signal; an analog mixer having a first mixer frequency coupled to the analog filter for frequency translating the filtered summer output signal to a frequency translated summer output signal having one or more frequency components different than the input frequency; a quantizer coupled to the analog mixer for sampling the frequency translated summer output signal at the sampling frequency and for generating the digital output signal; and a feedback branch coupled between the quantizer and summing device for providing the feedback analog signal to the summing device. The feedback branch includes: a digital mixer having a second mixer frequency coupled to the quantizer for frequency translating the digital output signal to a frequency translated digital output signal; and a digital-to-analog converter for converting the frequency translated digital output signal to the feedback analog signal having a frequency equal to the input frequency.

Another aspect of the present invention is a method for converting an analog input signal to a digital output signal, which in a preferred embodiment, includes the steps of: adding the analog input signal with a feedback analog signal for generating a combined analog signal representative of the sum of the analog input signal and the feedback analog signal; filtering undesired signal components from the combined analog signal; frequency translating the filtered combined analog signal to a first frequency translated signal having one or more frequency components different than the frequency of the analog input signal; sampling the first frequency translated signal at a sampling frequency to generate the digital output signal; frequency translating the digital output signal; and converting the digital output signal to the feedback analog signal having a frequency equal to the frequency of the analog input signal.

BRIEF DESCRIPTION OF THE DRAWINGS

For a complete understanding of the present invention and the advantages thereof, reference is now made to the following description taken in conjunction with the accompanying drawings in which like reference numbers indicate like features and wherein.

DETAILED DESCRIPTION OF THE INVENTION

Figure 1:
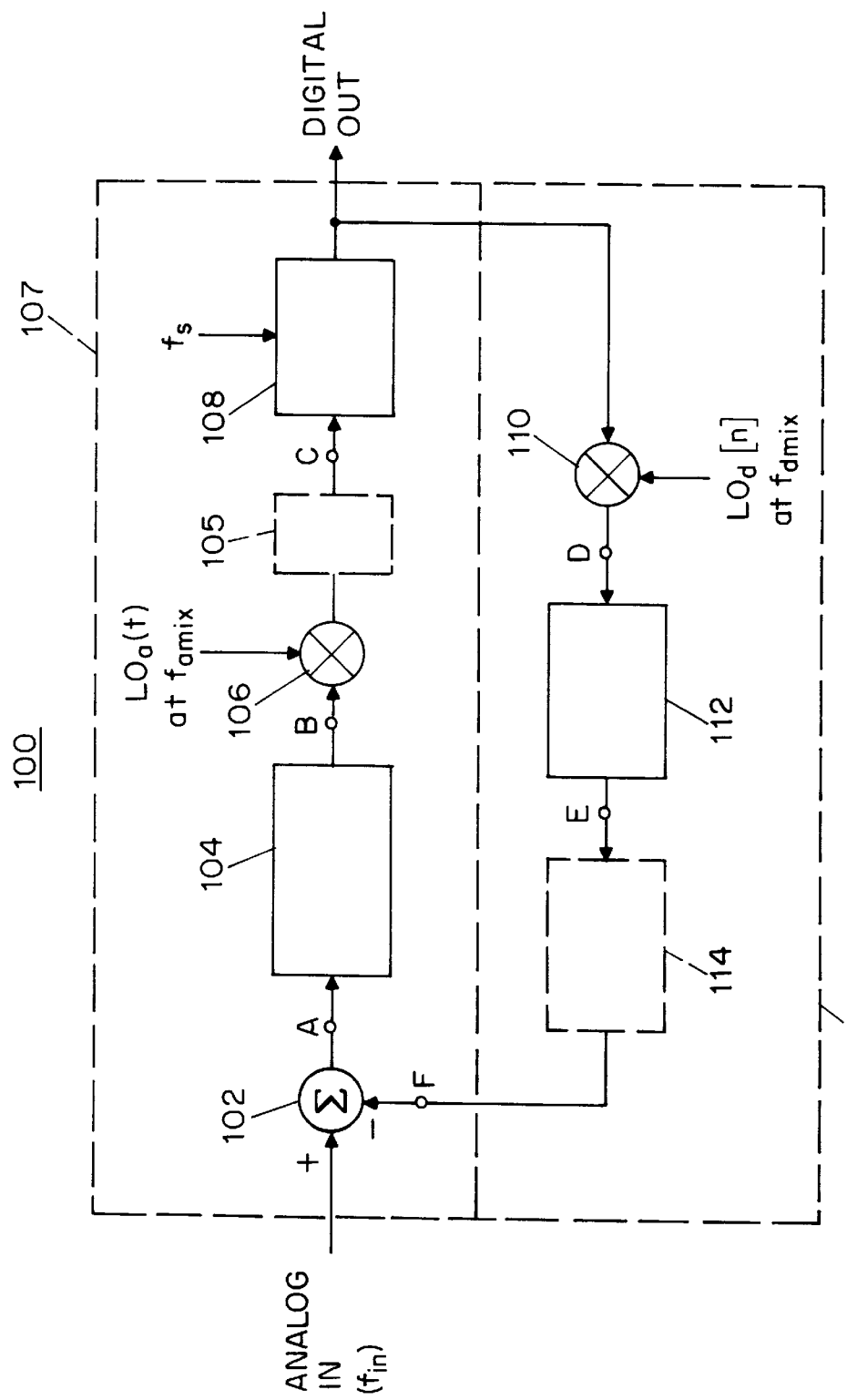
FIG. 1 is a block diagram of a frequency translating sigma-delta (Σ-Δ) modulator according to a preferred embodiment of the present invention.

FIG. 1 shows a preferred embodiment of a frequency translating sigma-delta (Σ-Δ) modulator 100 for converting an analog input signal ("ANALOG IN") having an input frequency $f_{in}$ to a digital output signal ("DIGITAL OUT") sampled at a sampling frequency $f_s$. The Σ-Δ modulator 100 includes a summing device 102 for adding the analog input signal with a feedback analog signal F and for generating a summer output signal A representative of the sum of the analog input signal and the feedback analog signal. The summer output signal A is filtered by an analog filter 104, which can be any frequency selective filter such as a continuous or discrete-time lowpass, bandpass or highpass filter. An analog mixer 106 receiving a mixing signal $LO_a$ having a mixer frequency $f_{amix}$ is provided for frequency translating the filtered summer output signal B to a frequency translated summer output signal C having one or more frequency components, e.g., $f_{in} \pm f_{amix}$, different than the input frequency $f_{in}$. As required, the analog mixer 106 can be used to translate the frequency spectrum of the filtered summer output signal B to higher or lower frequencies within the feedforward branch 107 of the Σ-Δ modulator 100. The frequency translated summer output signal C is then converted to the digital output signal by quantizer 108, which is coupled to the output of the analog mixer 106. The quantizer 108 is operated at sampling frequency $f_s$ and can be any suitable Nyquist rate converter, i.e., one-bit comparator or multi-bit flash converter, or another Σ-Δ A/D converter. Optionally, the Σ-Δ modulator 100 may also include a second analog filter 105, e.g., a lowpass filter, located between the analog mixer 106 and the quantizer 108 for filtering undesired frequency components from the frequency translated summer output signal.

As shown in FIG. 1, the Σ-Δ modulator 100 further includes a feedback branch 109 for providing an analog representation of the digital output signal to the summing device 102. The feedback branch 109 includes a digital mixer 110 receiving a mixing signal $LO_d$, i.e., a digital word stream, representing for example a sine wave having a second mixer frequency $f_{dmix}$. The digital mixer 110 takes two digital sequences, i.e., the fed-back digital output signal and the local oscillator signal $LO_d$, and outputs a signal D whose discrete Fourier transform has a frequency component equal to the analog input frequency $f_{in}$. The digital mixer 110 is coupled to the quantizer 108 for frequency translating the digital output signal to a frequency translated digital output signal D, which is provided to a digital-to-analog converter (DAC) 112 for converting the frequency translated digital output signal D to the feedback analog signal F having a frequency equal to the input frequency $f_{in}$. Optionally, the feedback branch 109 may also include an additional filter 114 coupled to the DAC 112 for filtering undesired signal components from the feedback analog signal F.

Figure 2:
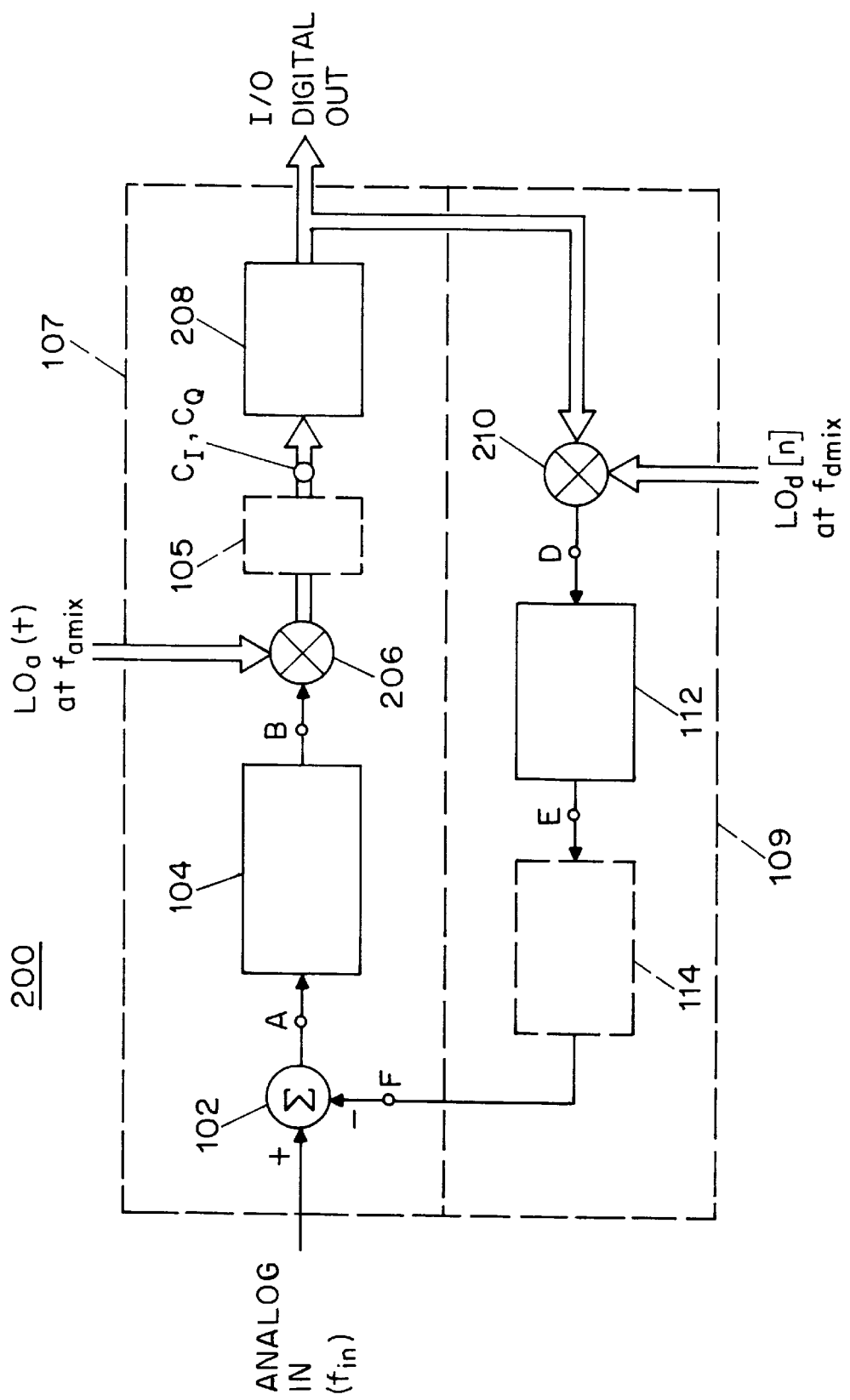
FIG. 2 is a block diagram of an I/Q frequency translating Σ-Δ modulator according to another preferred embodiment of the present invention.

FIG. 2 shows a block diagram of a Σ-Δ modulator 200 similar to the Σ-Δ modulator 100 of FIG. 1 constructed and arranged as an in-phase/quadrature ("I/Q") frequency translating Σ-Δ modulator. The I/Q Σ-Δ modulator 200 of FIG. 2 includes a complex analog mixer 206 for frequency translating the individual I/Q components of the filtered summer output signal B, and a complex quantizer 208 for sampling the I/Q components $C_I$ and $C_Q$ of the frequency translated summer output signal B at the sampling frequency $f_s$ and for generating I/Q components "I" and "Q" of the digital output signal. A complex digital mixer 210 is then provided in the feedback branch 109 for frequency translating the I/Q components of the digital output signal to a frequency translated digital output signal D.

Figure 3:
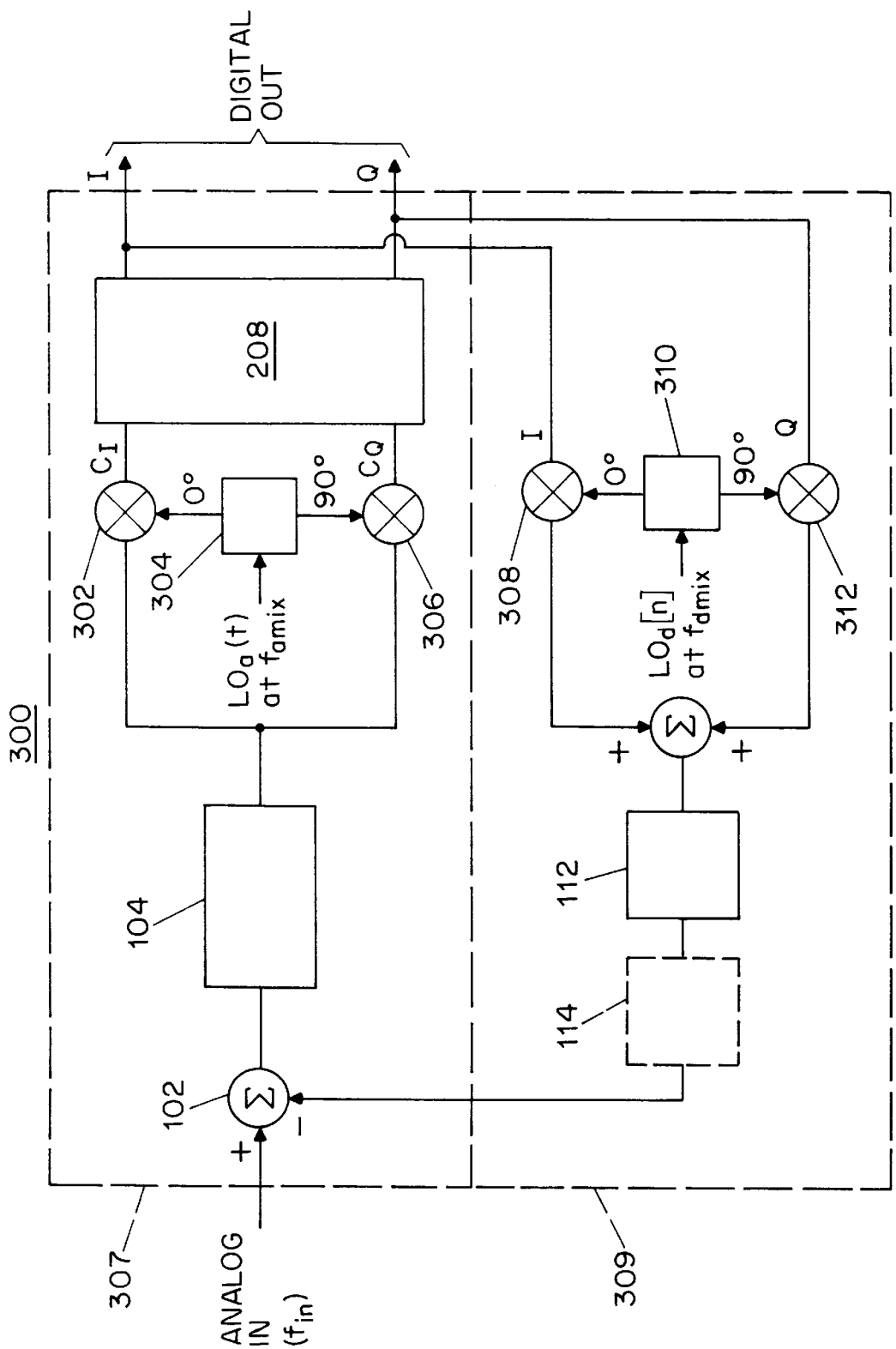
FIG. 3 is a block diagram of the I/Q frequency translating Σ-Δ modulator of FIG. 2 showing the in-phase and quadrature components of the feedforward and feedback branches.

FIG. 3 shows in detail the feedforward and feedback paths 307 and 309, respectively, of the I/Q Σ-Δ modulator 200 of FIG. 2. FIG. 3 in addition shows phase shifters 304 and 310 for creating mixing signals that are 0 degrees and 90 degrees out of phase corresponding to the in-phase and quadrature phase components, respectively.

Figure 4:
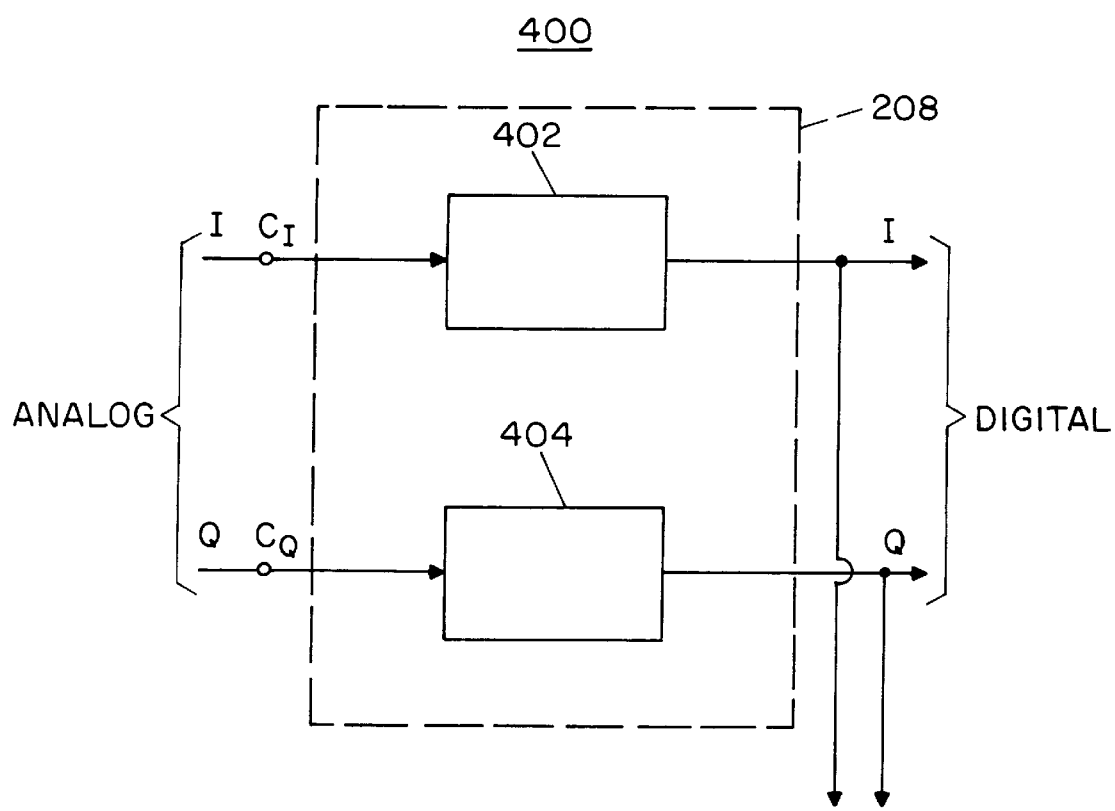
FIG. 4 is a block diagram of a dual Nyquist rate A/D converter for use as the complex quantizer in the I/Q frequency translating Σ-Δ modulator of FIG. 2.

FIG. 4 shows a block diagram of a dual Nyquist rate A/D converter 400 for use as the complex quantizer 208 in the I/Q Σ-Δ modulator 200 of FIG. 2. As shown in FIG. 4, the A/D converter 400 includes a pair of real A/D converters 402 and 404 corresponding to the individual in-phase and quadrature components $C_I$ and $C_Q$, respectively, of the frequency translated summer output signal. By way of example and not limitation, each of the converters 402 and 404 is a one-bit comparator or a multi-bit flash converter for outputting a digital high or low based on a predetermined voltage threshold value.

Figure 5:
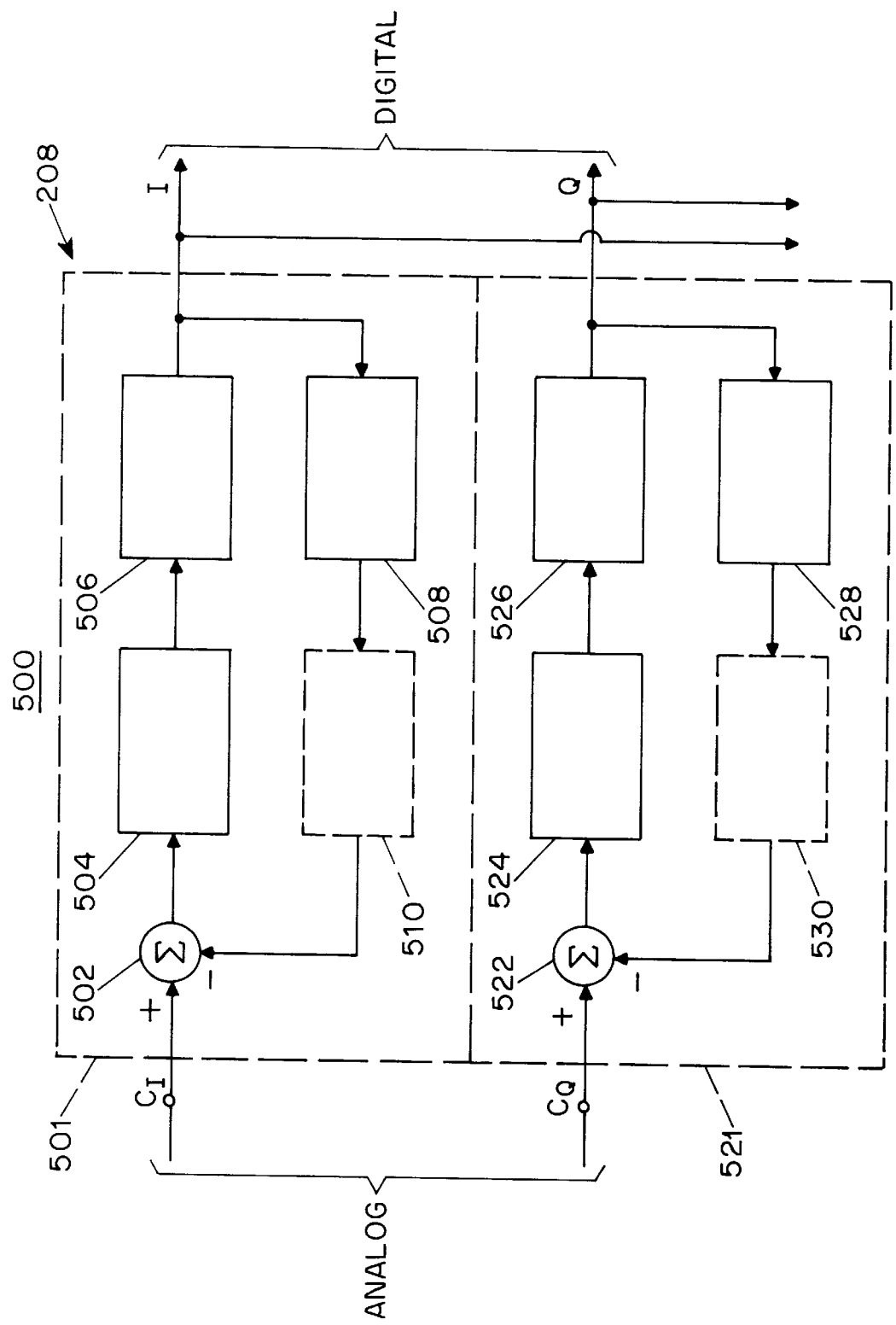
FIG. 5 is a block diagram of a dual Σ-Δ A/D converter for use as the complex quantizer in the I/Q frequency translating Σ-Δ modulator of FIG. 2.

FIG. 5 shows a block diagram of a dual Σ-Δ analog-to-digital converter 500 for use as the complex quantizer 208 in the I/Q Σ-Δ modulator 200 of FIG. 2. The converter 500 includes a pair of conventional Σ-Δ modulators 501 and 521 corresponding to the individual in-phase and quadrature components $C_I$ and $C_Q$, respectively, of the frequency translated summer output signal. Each Σ-Δ modulator 501/521 includes a summer 502/522, an analog filter 504/524, an A/D converter 506/526, and a DAC 508/528 feeding back to the summer 502/522. Preferably, the A/D converters 506/526 are one-bit voltage comparators. Although one-bit comparators are preferred for maximum linearity, multi-bit converters can also be used. In addition, where the translated analog signal has two or more frequency components, e.g., $f_{in} \pm f_{amix}$, first-order I/Q Σ-Δ modulators can be used to perform A/D conversion on the low frequency components only. Optional analog filters 510 and 530 can be provided for filtering the DAC 508/528 output for undesired frequency components.

Figure 6:
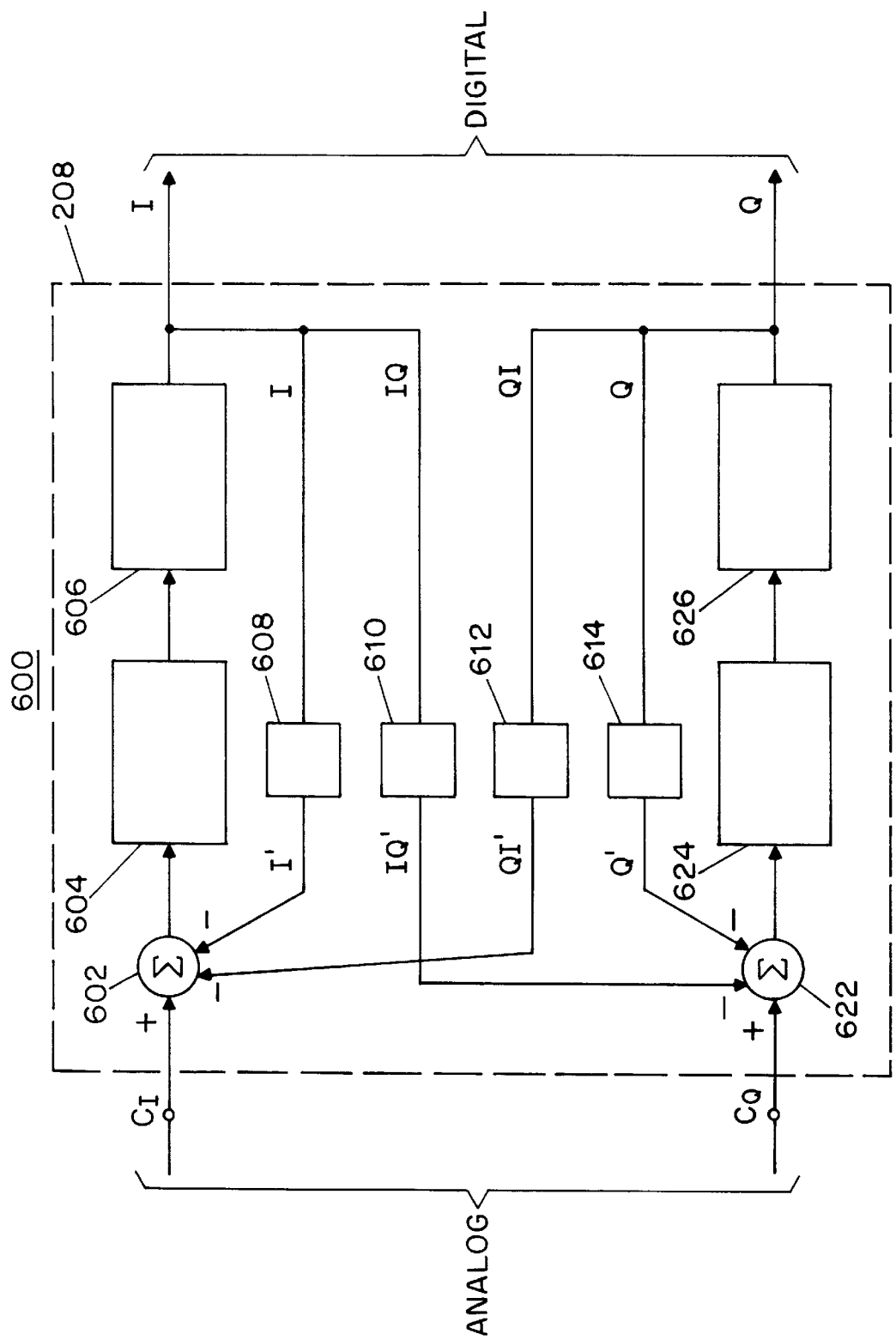
FIG. 6 is a block diagram of a complex Σ-Δ A/D converter for use as the complex quantizer in the I/Q frequency translating Σ-Δ modulator of FIG. 2.

FIG. 6 shows a block diagram of a single Σ-Δ A/D converter 600 for use as the complex quantizer 208 in the I/Q Σ-Δ modulator 200 of FIG. 2. As shown in FIG. 6, the Σ-Δ analog-to-digital converter 600 is similar to the converter of FIG. 5, except that each of the summing devices 602 and 622 include as their inputs both the fed back in-phase and quadrature signals. For example, the in-phase summing device 602 includes as its inputs the analog signal I' from the output of the in-phase A/D converter 606, and the analog signal QI' from the output of the quadrature-phase A/D converter 626. Similarly, the quadrature-phase summer 622 includes as its inputs the analog signal Q' and from the output of the quadrature-phase A/D converter 626, and the analog signal IQ' from the output of the in-phase A/D converter 606. Each of the analog signals I', IQ', QI' and Q' are derived from digital signals I, IQ, QI and Q, respectively, via DACs 608, 610, 612 and 614, respectively. Each of the DACs 608, 610, 612 and 614 provide corresponding gains $k_I$, $k_{IQ}$, $k_{QI}$ and $k_Q$ to the I', IQ', QI' and Q' analog signals.

Figure 7:
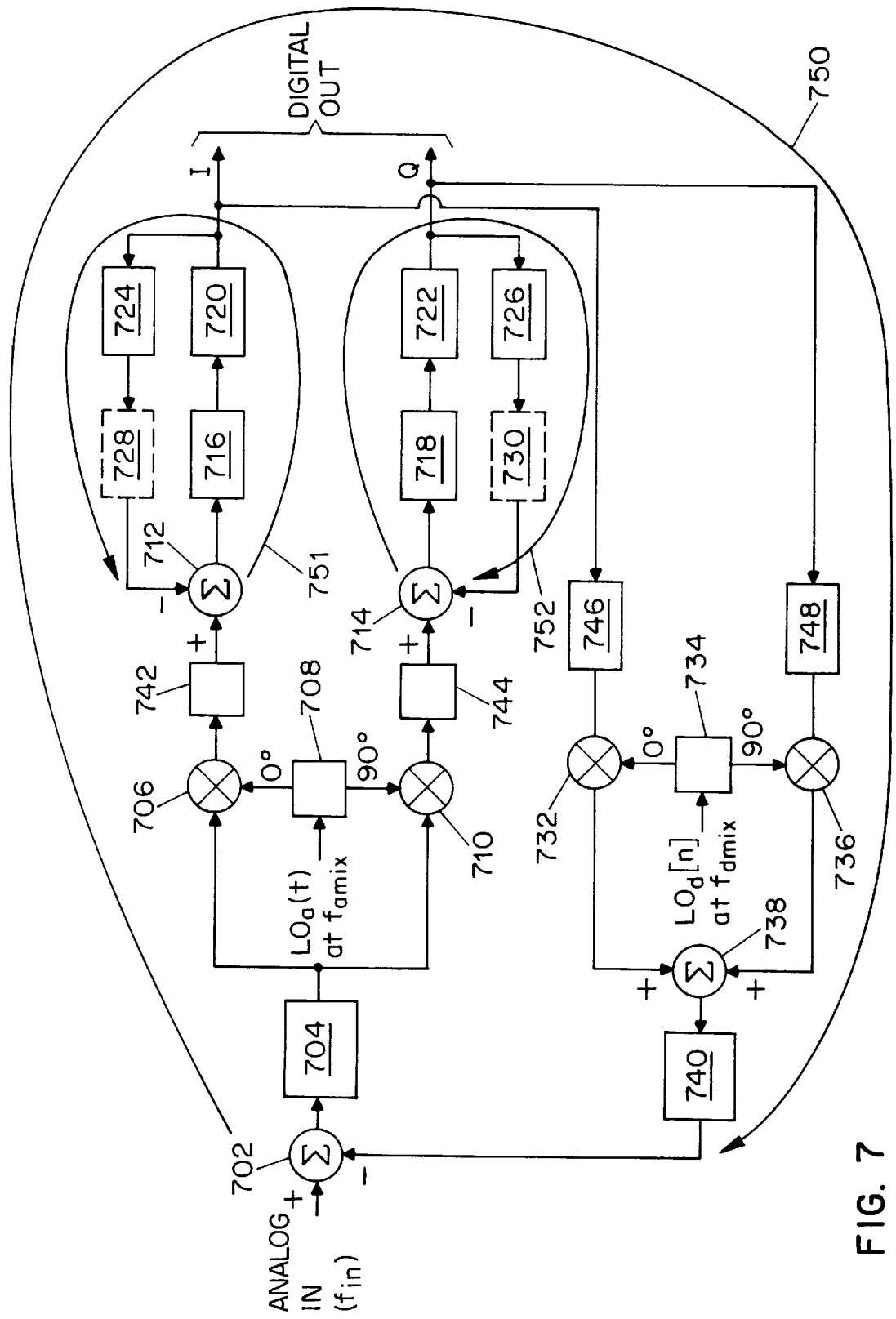
FIG. 7 is a block diagram of an I/Q frequency translating Σ-Δ modulator according to yet another preferred embodiment of the present invention.

FIG. 7 shows a block diagram of a I/Q frequency translating bandpass Σ-Δ modulator 700 utilizing the dual first-order Σ-Δ A/D converter 500 of FIG. 5 as the complex quantizer in the feedforward loop. The I/Q bandpass Σ-Δ modulator 700 uses direct conversion to baseband within the in-phase and quadrature paths of the global feedback loop. The device processes bandpass analog input signals with continuous-time circuitry, and I/Q baseband signals with switched-capacitor circuits.

As shown in FIG. 7, the I/Q bandpass Σ-Δ modulator 700 includes a summing device 702 and an analog filter 704 for filtering the output of the summing device 702. Advantageously, the analog filter 704 is a bandpass continuous-time resonator, which eliminates the need for front-end S/H circuitry. The analog filter 704 is designed to have a low quality factor, or Q, i.e., the ratio of the center frequency to the 3-db bandwidth, and as such provides improved performance without significantly impacting resolution of the device when large deviations from the center frequency are present.

To obtain high resolution, the A/D converter's gain around the global feedback loop 750 is kept high at the center frequency for quantization error attenuation. The bandpass signal at the resonator output is frequency translated to baseband by the analog I/Q mixers 706 and 710, which are coupled to phase shifter 708. The I/Q signals are then decimated down, preferably by a factor of two, by decimators 742 and 744 and processed at baseband by the respective first-order Σ-Δ modulators comprised of the summing devices 712/714, sampled-data integrators 716/718, A/D converters 720/722, DACs 724/726 and optional analog filters 728/730. The digital outputs from the A/D converters 720 and 722 are then interpolated up by a factor of two by interpolators 746 and 748, and translated back up to the original center frequency using the digital I/Q mixers 732 and 736, which are coupled to phase shifter 734.

Next, the frequency translated in-phase and quadrature digital signals are combined by summing device 738, and the resulting digital signal is converted from digital to analog form using DAC 740. Preferably, the DAC 740 is a one-bit DAC. The converted signal is then fed back to the summing device 702 and subtracted from the incoming analog input signal. Local feedback loops, indicated by arrows 751 and 752, around the baseband first-order sigma-delta modulators are used to stabilize the system.

Although gain and phase mismatch of the I/Q paths cause image signal leakage and loss of resolution, the effect of these mismatches is reduced by the Q of the analog filter 704 as compared to conventional complex bandpass Σ-Δ modulators. See J. O. Voorman, U.S. Pat. No. 5,157,343, "Electronic Arrangement for Receiving a Modulated Carrier Signal," issued Oct. 20, 1992; S. Jantzi and K. Martin, "A Complex Bandpass Sigma-Delta Converter for Digital Radio," IEEE Custom Integrated Circuits Conference, pp. 453–456 (1996). The analog filter 704 of the present embodiment also attenuates the effects of mixer non-linearities, particularly third-order non-linearities.

Translating the spectrum centered at $f_s/4$ to in-phase and quadrature signals at baseband is achieved by mixing the resonator output signal with a local oscillator having a frequency $f_{mix}=f_s/4$. The I/Q mixing signals can be, for example, sequences (1,0,−1,0 . . . ) and (0,1,0,−1 . . . ). When the sequence is equal to zero, there is no need for the sampled-data integrators 716 and 718 to process the down converted signals; hence, the I/Q paths can decimate by a factor of two and operate in a time-interleaved fashion. In the feedback path, zeroes are reinserted in both channels in an interpolation process and the I/Q signals are added. Alternatively, the DAC 740 can be time shared by both channels rather than directly implementing the summing device 738 of FIG. 7.

Figure 8:
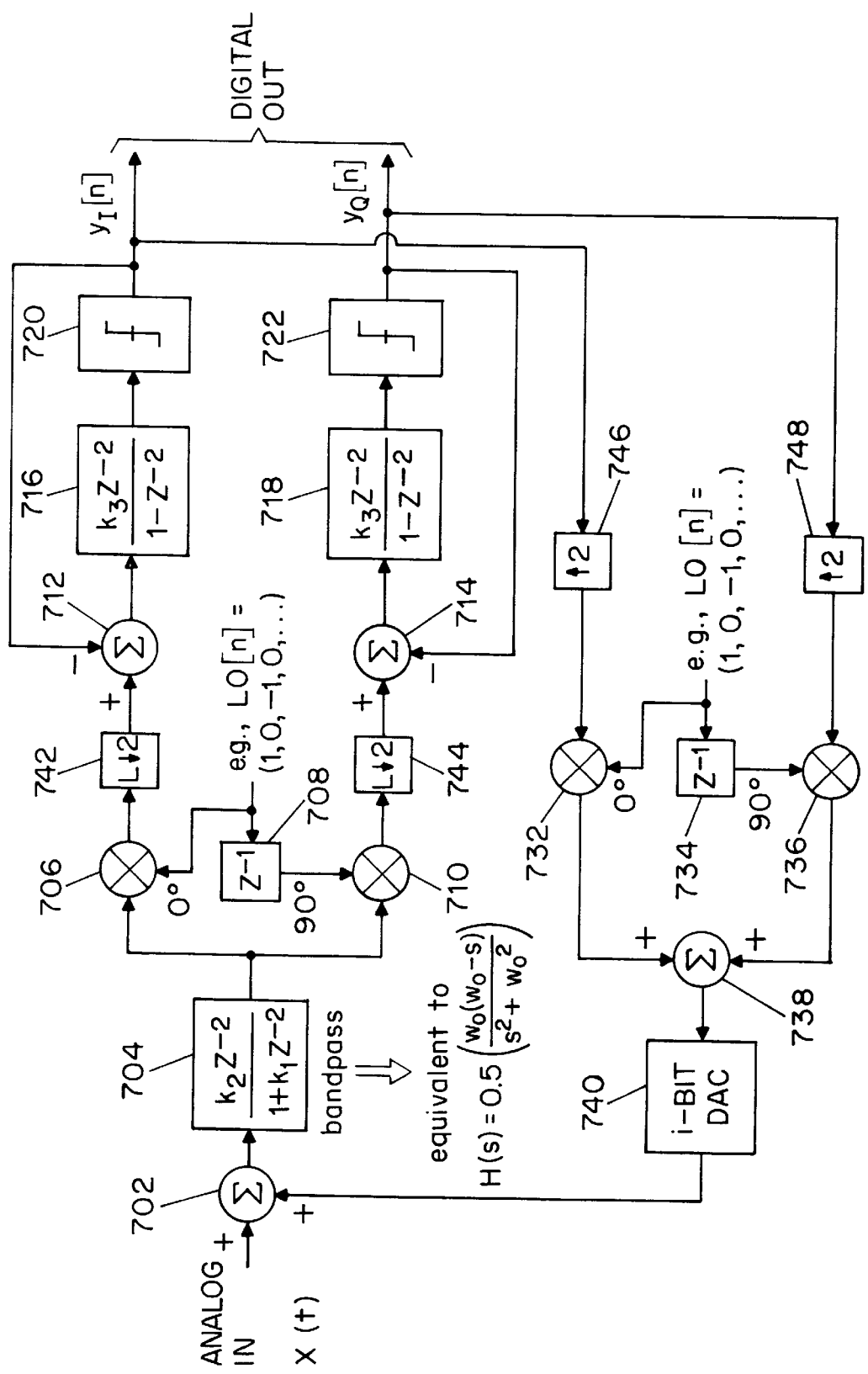
FIG. 8 is a z-domain representation of the I/Q frequency translating Σ-Δ modulator of FIG. 7.

Preferably, the DAC 740 is a non-return-to-zero (NRZ), 1-bit pulse shaping DAC and the analog filter 704 is a continuous-time bandpass resonator having the following transfer function: $H(s)=0.5*[\omega_0(\omega_0-s)]/[s^2+\omega_0^2]$. In the z-domain, as shown by the block diagram of FIG. 8, the in-phase (p=I) and quadrature (p=Q) outputs of the present embodiment can be modeled as:

$$Y_p(z) = \frac{(1-z^{-2})(1-k_1z^{-2})N_p(z) + k_2k_3X'_p(z)}{1+[(k_3-1)-k_1]z^{-2}+(k_2k_3-k_1k_3+k_1)z^{-4}} \quad (1)$$

where $k_2=k_3=0.5$, and $k_2$ and $k_3$ control the pole location of the quantization noise transfer function. $k_1$ represents the effect of the finite Q of the resonator and is close to unity. The sigma-delta modulators in the feedforward branch are first-order sigma-delta resonators having a sample rate of $f_s$, hence the delays $z^{-2}$ correspond to $z^{-1}$ at the sample rate of $f_s/2$. $X'_I(z)$ is the z-transform of the sequence LO[n−2]x[n−4], where LO[n] is the local oscillator sequence at the mixers 708 and 734, and is given by the expression: $X'_I(z)=-0.5z^{-4}[X(jz)+X(-jz)]$. $X'_I(z)$ is X(z) delayed and frequency translated to baseband. Similarly, $X'_Q(z)$ is the z-transform of the sequence LO[n−3]x[n−4] and is given by the expression: $X'_Q(Z)=-0.5jz^{-4}[X(jz)-X(-jz)]$. $N_I(z)$ is the quantization error of the in-phase first-order sigma-delta modulator and is modeled as an additive white noise source. $N_Q(z)$ is the quantization error of the quadrature channel.

Forming the output signal, $Y(z)=Y_I(z)+jY_Q(Z)$, and separating the transfer functions from the input source X(jz) and the quantization error sources $N_I(z)$ and $N_Q(z)$, the equivalent signal transfer function, STF(z), after frequency translation to baseband is:

$$STF(z) = \frac{k_2k_3z^{-4}}{1+[(k_3-1)-k_1]z^{-2}+(k_2k_3-k_1k_3+k_1)z^{-4}} \quad (2)$$

Similarly, the noise transfer function NTF(Z) is:

$$NTF(z) = \frac{(1-z^{-2})(1-k_1z^{-2})}{1+[(k_3-1)-k_1]z^{-2}+(k_2k_3-k_1k_3+k_1)z^{-4}} \quad (3)$$

NTF(Z) corresponds to a second-order conventional baseband sigma-delta with $z^{-2}$ replaced by $z^{-1}$. Quantization noise rejection associated with the present embodiment is less than a conventional second-order baseband sigma-delta if a finite Q resonator, i.e., $k_1<1$, is used.

The continuous-time resonator of FIG. 7 has been implemented as a Tow-Thomas active filter having a nominal center frequency of 25 kHz and Q of 10. Alternatively, other well-known continuous-time active or passive filtering techniques can be used. The analog mixers can be realized at the inputs of the first-order sigma-delta modulators by controlling the phasing of the sampling switches and using signal inversions.

Figure 9:
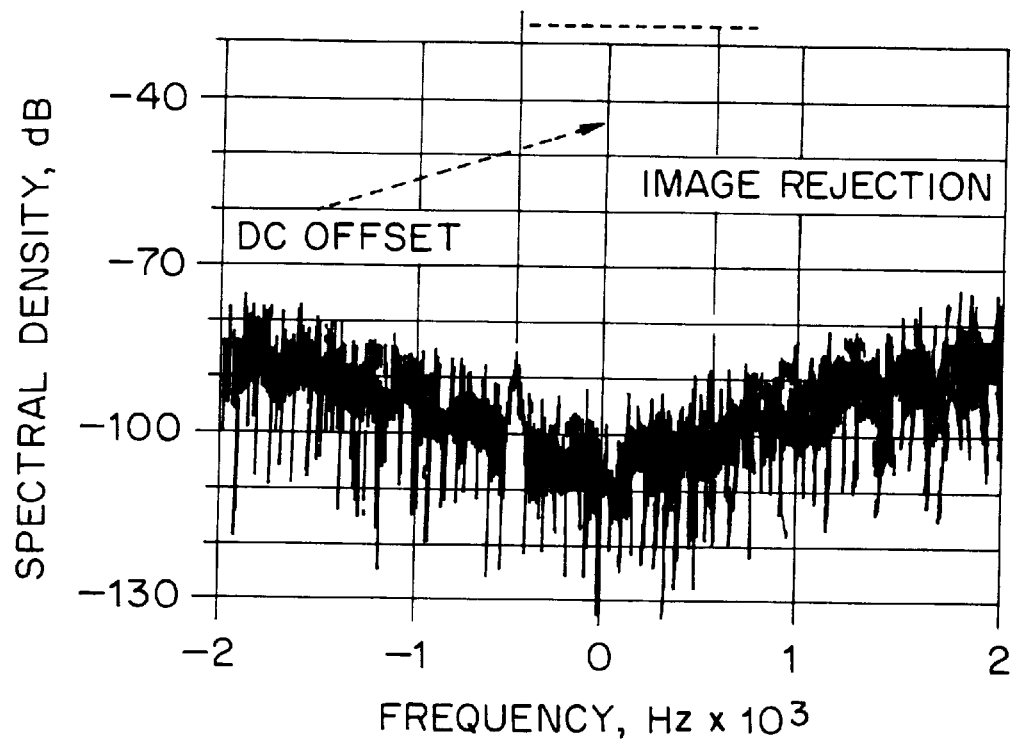
FIG. 9 shows the output spectrum corresponding to the I/Q frequency translating Σ-Δ modulator of FIG. 7.
Figure 10:
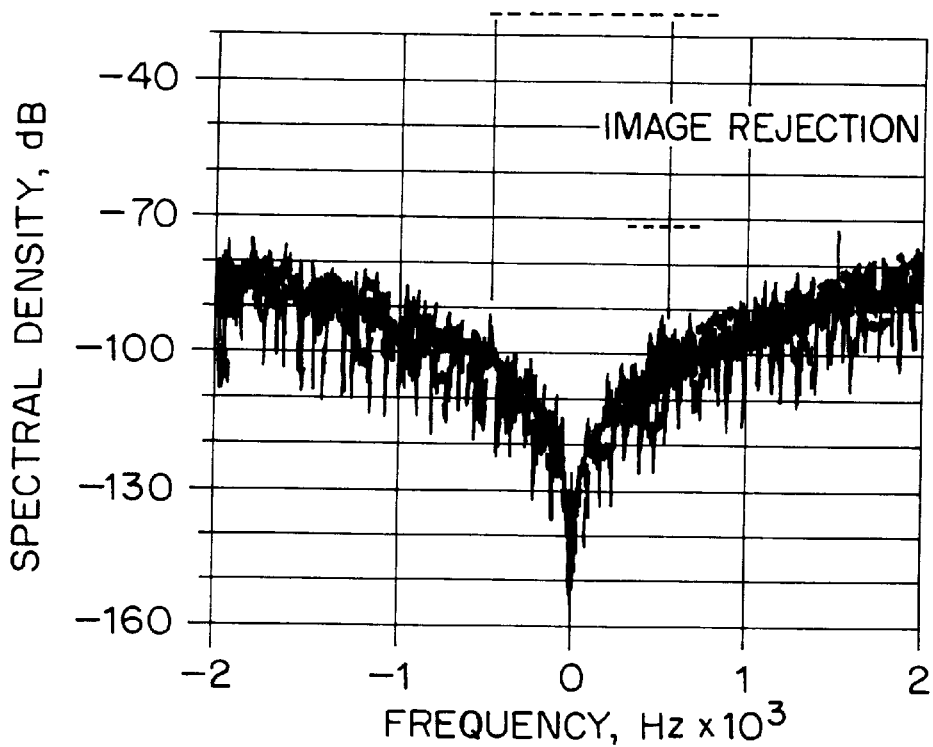
FIG. 10 shows the output spectrum corresponding to the I/Q frequency translating Σ-Δ modulator of FIG. 7 having a simulated mixer gain mismatch of approximately 5%.

FIG. 9 shows the 2 kHz baseband output spectrum when a 25.5 kHz sinusoid, with a peak amplitude at 20% of the DAC reference voltage is applied to a breadboard prototype operating at a 10 kHz clock frequency. Typical baseband noise shaping is shown. The image rejection is 52 dB. FIG. 10 is the simulated result with the same input and a 5% mixer gain mismatch, which indicates an image 48 dB below the desired signal. Both are in good agreement with the calculated value of $-20 \log_{10}[0.05/(2Q)]=52$ dB. This formula is only valid for small mismatches. To further verify the image rejection capability of the modulator under large mismatch conditions, one of the mixers was given a gain of two while the other one was unity. Simulation yields an image rejection ratio of 26 dB while measurement yields 23.3 dB. The same quadrature mixer used in an open loop configuration would give an image rejection of only 9 dB.

A new bandpass sigma-delta modulator structure has been shown that uses embedded mixers and performs most of the noise shaping at baseband, with robust sampled-data circuitry.

The approach utilizes frequency translation inside the feedback loop, which permits most of the analog signal processing to be performed at baseband where circuits can be made robust. Both continuous-time and sample-data circuit techniques are used to maximize the center frequency and converter resolution. Use of a low Q resonator in the feedforward loop attenuates the effect of I/Q mismatches and mixer non-linearity in contrast to conventional approaches.

Although the present invention has been described in connection with particular embodiments thereof, it is to be understood that various modifications, alterations and adaptions may be made by those skilled in the art without departing from the spirit and scope of the invention. It is intended that the invention be limited only by the appended claims.

What is claimed is:

1. An electronic device for converting an analog input signal having an input frequency to a digital output signal sampled at a sampling frequency, comprising:

a summing device for adding said analog input signal with a feedback analog signal and for generating a summer output signal representative of the sum of said analog input signal and said feedback analog signal;

an analog filter coupled to said summing device for filtering undesired signal components from said summer output signal;

an analog mixer receiving a first mixing signal having a first mixer frequency coupled to said analog filter for frequency translating said filtered summer output signal to a frequency translated summer output signal having one or more frequency components different than said input frequency;

a quantizer coupled to said analog mixer for sampling said frequency translated summer output signal at said sampling frequency and for generating said digital output signal;

a feedback branch coupled between said quantizer and summing device for providing said feedback analog signal to said summing device, said feedback branch comprising:

a digital mixer receiving a second mixing signal having a second mixer frequency coupled to said quantizer for frequency translating said digital output signal to a frequency translated digital output signal; and a digital-to-analog converter for converting said frequency translated digital output signal to said feedback analog signal having a frequency equal to said input frequency.

2. The device according to claim 1, wherein said feedback branch comprises:

a digital-to-analog converter for converting said frequency translated digital output signal to a converter output signal;

a second analog mixer coupled to said digital-to-analog converter, said analog mixer receiving a second mixing signal having a second mixer frequency, for frequency translating said converter output signal to said feedback analog signal having a frequency equal to said input frequency.

3. The device according to claim 2, wherein said feedback branch further comprises a second analog filter coupled to said second analog mixer for filtering undesired frequency components from said feedback analog signal.

4. The device according to claim 2, wherein:

said analog mixer is a complex analog mixer for generating in-phase and quadrature components of said frequency translated summer output signal;

said quantizer is a complex quantizer for sampling said in-phase and quadrature components of said frequency translated summer output signal at said sampling frequency and for generating in-phase and quadrature components of said digital output signal;

said digital-to-analog converter is a complex digital-to-analog converter for converting said in-phase and quadrature components of said digital output signal to corresponding in-phase and quadrature converter output signals;

said second analog mixer is a second complex analog mixer for frequency translating said in-phase and quadrature converter output signals;

a second summer for combining said frequency translated in-phase and quadrature converter output signals; and a digital-to-analog converter for converting said combined frequency translated in-phase and quadrature converter output signals to said feedback analog signal having a frequency equal to said input frequency.

5. The device according to claim 1, wherein:

said analog mixer is a complex analog mixer for generating in-phase and quadrature components of said frequency translated summer output signal;

said quantizer is a complex quantizer for sampling said in-phase and quadrature components of said frequency translated summer output signal at said sampling frequency and for generating in-phase and quadrature components of said digital output signal; and said digital mixer is a complex digital mixer for frequency translating said in-phase and quadrature components of said digital output signal to said frequency translated digital output signal.

6. The device according to claim 5, wherein said feedback branch further comprises a second analog filter coupled to said digital-to-analog converter for filtering undesired signal components from said feedback analog signal.

7. The device according to claim 13, wherein said feedback branch further comprises a second analog filter coupled to said second summer for filtering undesired frequency components from said feedback analog signal.

8. The device according to claim 1, wherein said analog filter comprises a lowpass filter.

9. The device according to claim 1, wherein said analog filter comprises a bandpass filter.

10. The device according to claim 1, wherein said analog filter comprises a highpass filter.

11. The device according to claim 1, wherein said first mixer frequency is equal to said second mixer frequency.

12. The device according to claim 1, further comprising a second analog filter between said analog mixer and said quantizer for filtering undesired signal components from said frequency translated summer output signal.

13. The device according to claim 1, wherein said quantizer is a Nyquist rate converter.

14. The device according to claim 1, wherein said quantizer is sigma-delta modulator.

15. The device according to claim 1, wherein said quantizer performs analog-to-digital conversion of said frequency translated summer output signal only on a desired one of said frequency components of said frequency translated summer output.

16. The device according to claim 1, wherein said feedback branch further comprises a second analog filter coupled to said digital-to-analog converter for filtering undesired signal components from said feedback analog signal.

17. In an electronic device for converting an analog input signal to a digital output signal, a method comprising the steps of:

adding said analog input signal with a feedback analog signal and for generating a combined analog signal representative of the sum of said analog input signal and said feedback analog signal;

filtering undesired signal components from said combined analog signal;

frequency translating said filtered combined analog signal to a first frequency translated signal having one or more frequency components different than the frequency of said analog input signal;

converting said first frequency translated signal at a sampling frequency to generate said digital output signal;

frequency translating said digital output signal; and converting said digital output signal to said feedback analog signal having a frequency equal to the frequency of said analog input signal.

18. The method according to claim 17, further comprising the step of filtering undesired signal components from said first frequency translated signal.

19. The method according to claim 17, further comprising the step of filtering undesired signal components from said feedback analog signal.

20. The method according to claim 17, wherein said converting step is performed only on a desired one of said frequency components of said first frequency translated signal.

* * * * *